Figure 1:
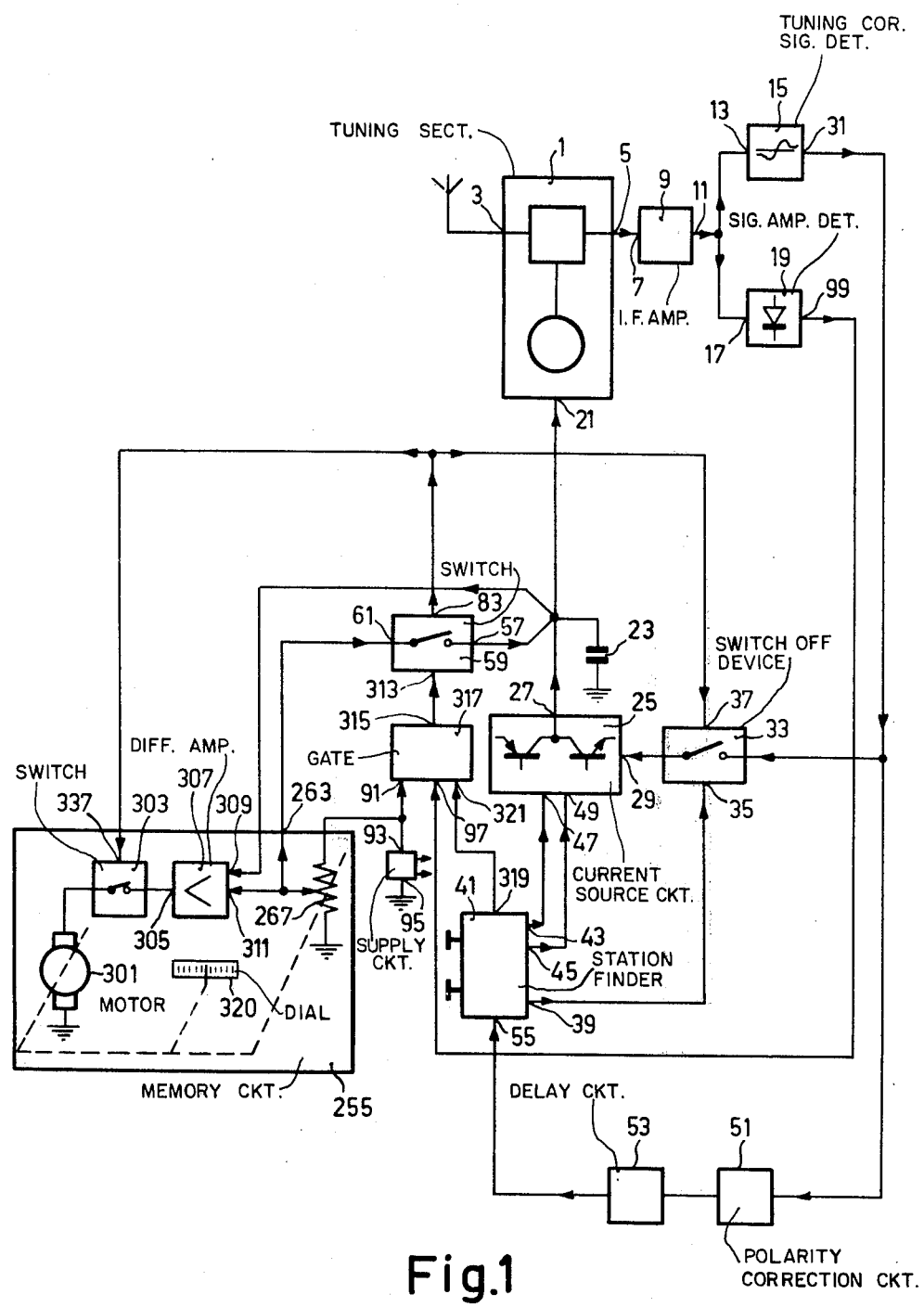

United States Patent [19]
Garskamp

[11] 3,968,442
[45] July 6, 1976

[54] RECEIVER TUNING CIRCUIT
[75] Inventor: Arnoldus Garskamp, Eindhoven, Netherlands
[73] Assignee: U.S. Philips Corporation, New York, N.Y.
[22] Filed: Feb. 21, 1975
[21] Appl. No.: 551,644

[30] Foreign Application Priority Data
Feb. 27, 1974 Netherlands .................. 7402624

[52] U.S. Cl. .................. 325/422; 325/453; 325/470; 325/471; 334/16
[51] Int. Cl.² .................. H04B 1/34
[58] Field of Search .................. 325/416–423, 325/453, 464, 465, 466, 468–471, 335, 346; 334/14–16; 178/5.8 AF

[56] References Cited
UNITED STATES PATENTS

| | | | |
|---|---|---|---|
| 2,501,883 | 3/1950 | Weaver | 325/421 |
| 2,777,054 | 1/1957 | Dahlberg, Jr. | 325/423 |
| 2,847,567 | 8/1958 | Jacobsen | 325/423 |
| 2,856,519 | 10/1958 | Gray et al. | 325/420 |
| 2,977,466 | 3/1961 | Slater | 325/423 |
| 3,447,087 | 5/1969 | Takezaki et al. | 325/422 |
| 3,559,076 | 1/1971 | Worcester | 325/470 |
| 3,560,858 | 2/1971 | Sakai et al. | 325/470 |
| 3,644,853 | 2/1972 | Ma | 334/15 |
| 3,757,228 | 9/1973 | Klank | 325/470 |
| 3,760,193 | 9/1973 | Sakamoto | 307/233 |

*Primary Examiner*—Robert L. Griffin
*Assistant Examiner*—Marc E. Bookbinder
*Attorney, Agent, or Firm*—Frank R. Trifari; Henry I. Steckler

[57] ABSTRACT

A tuning circuit in which when the field strength of a received signal drops out, a tuning voltage from a switch can be applied to a capacitor so that the circuit stays tuned to the received signal. The voltage at the capacitor can further be controlled from a finding signal generator so that a station finding action which is independent of the inertia of the servo control can take place.

4 Claims, 2 Drawing Figures

RECEIVER TUNING CIRCUIT

The invention relates to a receiver tuning circuit having a tuning section which is tunable by means of a tuning voltage obtained from a capacitor. The charge on the capacitor can be changed by means of a current source circuit controllable by at least an automatic tuning correction signal, and furthermore a desired tuning voltage can temporarily be applied to said capacitor with the aid of a switch for immediately tuning to a desired frequency.

A tuning circuit of the above-mentioned kind is known from the German Offenlegungsschrift No. 2,025,369 in which the said capacitor can be connected optionally to a tuning potentiometer by means of a push-button switch for applying a voltage determined by said potentiometer to the relevant capacitor as long as the push-button switch is actuated. The automatic tuning correction signal then corrects a tuning frequency selected in this manner through the current source circuit which adapts the charge of the said capacitor.

It is an object of the invention to provide an improvement of such a tuning circuit which makes it suitable for use in movable receivers, in particular motorcar radio receivers.

To this end, a receiver tuning circuit of the type disclosed in the prior patent is characterized according to the invention in that the switch is coupled to a tap of a potentiometer which can be adjusted by means of a motor. The motor is coupled to an output of a difference amplifier a first input of which is coupled to the said capacitor and a second input of which is coupled to the tap which can be adjusted by the motor. An operating signal input of the switch is coupled to an output of a circuit which can provide an indication signal on the reception of a received signal.

Due to the use of a potentiometer which can be actuated by a motor and a switch which can be controlled in the described manner, for example, by a signal which is dependent on the field strength, a memory circuit is obtained which, when the field strength of a received signal drops out, determines the tuning of a receiver by means of the potentiometer adjusted by the motor, which potentiometer has a memory action which is independent of time and is even not lost when the supply voltage is switched off.

In addition, a receiver having a tuning circuit according to the invention and a station finder circuit has the advantage that the station finder circuit can operate fully independently of the motor circuit so that a rapid and inertia-free station finding action can take place.

Figure 2:
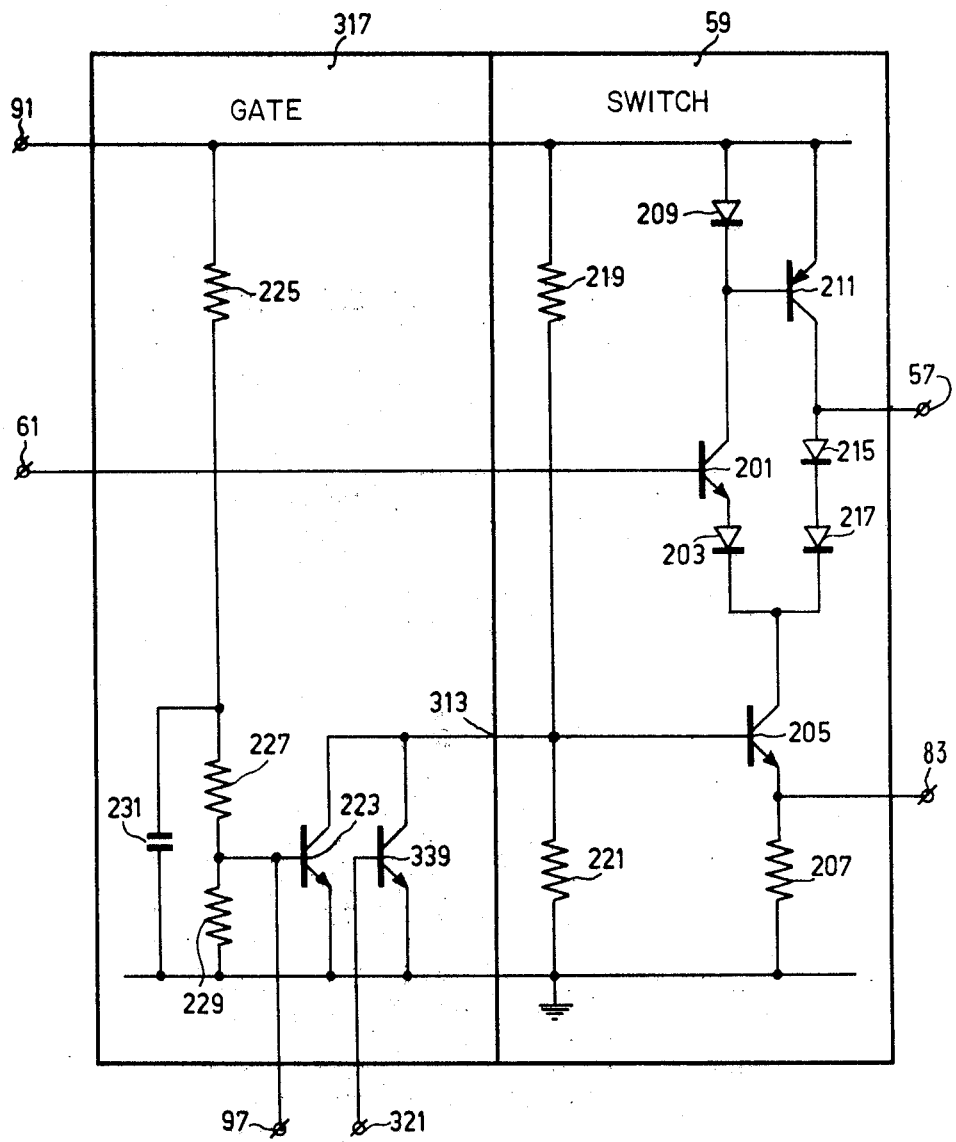

The invention will now be described in greater detail, by way of example, with reference to the accompanying drawing, in which:

FIG. 1 shows a block circuit diagram of a receiver-tuning circuit according to the invention, and FIG. 2 shows a principle circuit diagram of a possible embodiment of a part of the receiver-tuning circuit shown in FIG. 1.

In FIG. 1 a tuning section 1 has an input 3 to which a received high frequency signal is applied, and an output 5 from which an intermediate frequency signal is derived. Said intermediate frequency signal is applied to an input 7 of an intermediate frequency amplifier 9 and derived, after amplification, from an output 11 of said amplifier and applied to an input 13 of a tuning correction signal detector 15 and an input 17 of a signal amplitude detector 19.

The tuning section 1 furthermore has an input 21 which receives a tuning voltage from a capacitor 23. The charge of the capacitor 23 can be changed by means of a current source circuit 25 for which purpose an output 27 thereof is connected to the capacitor 23 the other end of which is connected to earth.

An input 29 of the current source circuit 25 is controlled by a tuning correction signal derived from an output 31 of the tuning correction signal detector 15, which signal can be rendered inactive with the aid of a switch-off device 33 incorporated in the connection between the output 31 and the input 29 and with the aid of signals applied to the input 35 or 37 of said circuit.

For this purpose, the input 35 of the switch-off device 33 is connected to an output 39 of a station finder 41, two outputs 43, 45 of which are connected to the inputs 47, 49 of the current source circuit 25. The station finder 41 is a well known sawtooth generator device, not part of this invention, including control outputs that indicate its state and a control input to stop the station finding action. In this manner the station finder 41 can continuously bring about a charge or discharge of the capacitor 23 when the automatic tuning correction is switched off, so that the tuning section is continuously detuned. When a station has been found, a signal is produced at the output 31 of the tuning correction signal detector 15, which signal causes a stop signal at an input 55 of the station finder 41 via a polarity correction circuit 51 and a delay circuit 53. The stop signal is maintained for a certain period, for example 1.5 seconds, so that station finding is temporarily discontinued and the automatic tuning correction is activated. As a result, tuning is effected immediately and correctly at the frequency of the received station and if said station is not desired, further station finding can be continued after 1.5 seconds.

The capacitor 23 providing the tuning voltage for the tuning section 1 may be controlled not only by the current source circuit 25, but also by an output 57 of a switch 59 an input 61 of which is connected to an output 263 of a memory circuit 255.

A voltage originating from a potentiometer 267 can be temporarily applied to the capacitor 23 with the aid of the switch 59.

The potentiometer 267 can be adjusted by a motor 301 which is connected to an output 305 of a difference amplifier 307 via a switch 303. The difference amplifier 307 comprises a first input 309 which is connected to the capacitor 23 and a second input which is connected to the adjustable tap of the potentiometer 267.

When the switch 303 is closed, the motor 301 will move the tuning potentiometer 267 in such a position that the tap on said potentiometer conveys a voltage which is equal to the tuning voltage at the capacitor 23. Said voltage can be applied to the capacitor 23 via the switch 59 when the field strength of the received station is too small. An operating signal input 313 of the switch 59 is for that purpose connected to an output 315 of a gate circuit 317 to the input 97 of which a signal which depends upon the field strength and originates from an output 99 of the signal amplitude detector 19 is applied. When the field strength of a received station is too small, the switch 59 will be closed. As a result of this, a voltage will occur at an output 83 of said switch 59 and be applied to the operating signal input 37 of the switch 33 connected thereto and an operating signal input 337 of the switch 303, so that the automatic tuning and the motor 301 are deactuated. As a result of this, the tuning voltage at the capacitor 23 still shows the value which corresponds to the last found desired station. By actuating the station finder 41, said tuning may be changed again, if desired. The station finder 41 than applies a voltage to an output 319, which voltage is applied to an input 321 of the gate circuit 317 so that the switch 59 is opened and the switch 303 is closed until a desired station is tuned again and the station finding action is stopped.

The gate circuit 317 furthermore comprises an input 91 which is connected to a connection 93 of a supply circuit 95 which feeds inter alia the potentiometer 267.

The motor 301 may in addition actuate a tuning scale 320 so as to indicate the tuning station.

Instead of a simple switch 59 which is actuated by a gate circuit to which a combination of signals is applied, for example, a series and/or parallel circuit of switches may of course be used which are each actuated by a single signal.

FIG. 2 shows a possible embodiment of a combination of a gate circuit 317 and a switch 59. The inputs and output are referred to by the same reference numerals as the corresponding inputs and outputs of FIG. 1.

The input 61 of the switch 59 is connected to the base of an npn transistor 201. The emitter of said transistor 201 is connected, via a diode 203, to the collector of an npn transistor 205 connected as a current current source whose emitter is connected to the output 83 and further connected to earth via a resistor 207.

The collector of the transistor 201 is connected via a diode 209 to an input 91 to which the supply voltage is applied. The diode 209 shunts the base-emitter path of a pnp transistor 211 which together with the diode 209 constitutes a current mirror circuit. The collector of the transistor 211 allows a current to flow through a series circuit of two diodes 215, 217, which current has substantially the same strength as the current through the diode 203. Furthermore, the diode 217 is connected to the collector of the transistor 205, while the junction of the collector of the transistor 211 and the diode 215 is connected to the output 57.

The base of the transistor 205 is connected to a tap of a potential divider 219, 221 between the supply voltage and earth. Said potential divider will raise the voltage at the base of the transistor 205 to such an extent that it produces a current which is further determined by the emitter resistor 207, equally distributed over the collector branches with the diode 203 and the transistor 201 and with the diodes 217 and 215, respectively. When the circuit is designed in an integrated form, it can be achieved in a simple manner that the output 57 will always assume the same voltage as the input 61. Since the output 57 is connected to the capacitor 23, both a discharge and a charge of this capacitor should be possible. Charging is effected via a transistor 211 and discharging via the diodes 215, 217. The circuit is independent of temperature influences. It is the object of the diode 203 to prevent the occurrence of too large a voltage difference at the base-emitter junction of the transistor 201.

The current source 25 can be turned off by connecting the base of the transistor 205 to earth with the aid of an npn transistor 223 connected across the resistor 221. This is effected when the base of the said transistor receives a voltage from a potential divider comprising three resistors 225, 227, 229. However, when the base of the transistor 223 receives a low voltage through the input or the input 97, the transistor 223 is cut off and the transistor 205 is conductive so that the switch 59 is closed.

The voltage at the base of the transistor 223 remains low for some time after switching on the supply voltage as a result of the fact that a capacitor 231 which is connected to the junction of the resistors 225 and 227 must first be charged. Thus, the switch 59 is closed during said period.

Furthermore, the voltage at the base of the transistor 205 can be influenced by a transistor 339 whose collector is connected to the base of the transistor 205; the emitter is connected to earth and the base is connected to the input 321 to which a positive voltage is applied when the station finder 41 is active, so that the switch 59 is then opened.

The input 97 is connected to the base of the transistor 223 so that the transistor 223 is also cut off and the switch 59 becomes conductive when the voltage at the input 97 becomes low upon a drop-out of a transmitter signal.

The switch 59 in this embodiment also acts as an amplifier so that the adjustment of the potentiometer 267 exerts no influence on the rate at which the charge of the capacitor 23 is changed.

What is claimed is:

1. A receiver tuning circuit for a receiver having a tuning section and means for providing a tuning correction signal and a signal representative of a received signal amplitude; said circuit comprising a capacitor means for applying a tuning signal to said tuning section; a current source for supplying said tuning signal to said capacitor and further controlled by said tuning correction signal; a potentiometer having a pair of end means for receiving a voltage thereacross and a tap; a differential amplifier having a first input coupled to said capacitor, a second input coupled to said tap, and an output; a motor means coupled to said amplifier output and to said tap for adjusting the position of said tap on said potentiometer; and a switch means coupled between said tap and said capacitor for temporarily applying a tuning voltage to said capacitor to immediately tune to a desired frequency when said received signal amplitude falls below a selected level, said switch means having a control signal input means for receiving said amplitude representative signal.

2. A receiver tuning circuit as claimed in claim 1 further comprising a voltage supply circuit coupled to said end means, and means for temporarily applying the voltage at said tap to said capacitor when said supply is switched on including a time constant circuit coupled between said supply circuit and said switch means.

3. A receiver tuning circuit as claimed in claim 1, wherein said switch means comprises a current source which can be influenced by a control signal, and two parallel branches coupled to said current source, the first branch comprising a transistor having an emitter coupled to said current source, a base coupled to said tap and a collector, a current mirror circuit having an input coupled to said collector and an output, the second parallel branch comprising a diode coupled to the current source and to said output of the current mirror circuit, said diode being coupled to said capacitor.

4. A receiver-tuning circuit as claimed in claim 3, wherein the control signal for the current source originates from a gate circuit.

* * * * *